(12) United States Patent
Lin et al.

(10) Patent No.: US 8,242,537 B2
(45) Date of Patent: Aug. 14, 2012

(54) IGBT WITH FAST REVERSE RECOVERY TIME RECTIFIER AND MANUFACTURING METHOD THEREOF

(75) Inventors: Wei-Chieh Lin, Hsinchu (TW);
Jen-Hao Yeh, Kaohsiung County (TW);
Ho-Tai Chen, Taipei County (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 533 days.

(21) Appl. No.: 12/615,278

(22) Filed: Nov. 10, 2009

(65) Prior Publication Data

US 2011/0079819 A1 Apr. 7, 2011

(30) Foreign Application Priority Data

Oct. 6, 2009 (TW) .................. 98133846 A

(51) Int. Cl.
*H01L 29/739* (2006.01)
*H01L 21/331* (2006.01)

(52) U.S. Cl. ........ 257/142; 257/130; 257/139; 257/140; 257/141; 257/E29.195; 257/E29.196; 257/E29.197; 257/E29.198; 257/E29.199; 257/E21.382; 438/133; 438/135; 438/136

(58) Field of Classification Search .................. None
See application file for complete search history.

(56) References Cited

U.S. PATENT DOCUMENTS

| | | | |
|---|---|---|---|
| 4,841,345 A | 6/1989 | Majumdar | |
| 4,985,741 A | 1/1991 | Bauer | |
| 5,079,607 A | 1/1992 | Sakurai | |
| 5,178,370 A | 1/1993 | Clark | |
| 5,291,050 A | 3/1994 | Nishimura | |
| 5,292,672 A | 3/1994 | Akiyama | |
| 5,459,339 A * | 10/1995 | Sakurai et al. | 257/167 |
| 5,572,048 A | 11/1996 | Sugawara | |
| 5,578,508 A | 11/1996 | Baba | |
| 5,629,535 A | 5/1997 | Ajit | |
| 5,644,148 A * | 7/1997 | Kinzer | 257/133 |
| 5,670,811 A | 9/1997 | Mori | |
| 5,702,961 A | 12/1997 | Park | |
| 5,723,882 A | 3/1998 | Okabe | |
| 5,757,033 A | 5/1998 | Ajit | |
| 6,051,850 A | 4/2000 | Park | |
| 6,091,086 A | 7/2000 | Zommer | |
| 6,146,947 A | 11/2000 | Okabe | |
| 6,221,721 B1 | 4/2001 | Takahashi | |
| 6,232,186 B1 | 5/2001 | Patel | |
| 6,236,069 B1 | 5/2001 | Shinohe | |
| 6,239,466 B1 | 5/2001 | Elasser | |
| 6,576,935 B2 | 6/2003 | Onishi | |
| 6,586,798 B1 | 7/2003 | Frisina | |
| 7,084,034 B2 | 8/2006 | Frisina | |
| 7,417,266 B1 | 8/2008 | Li | |
| 2011/0057230 A1 * | 3/2011 | Udrea et al. | 257/141 |

* cited by examiner

*Primary Examiner* — Hrayr A Sayadian
(74) *Attorney, Agent, or Firm* — Winston Hsu; Scott Margo

(57) ABSTRACT

An IGBT with a fast reverse recovery time rectifier includes an N-type drift epitaxial layer, a gate, a gate insulating layer, a P-type doped base region, an N-type doped source region, a P-type doped contact region, and a P-type lightly doped region. The P-type doped base region is disposed in the N-type drift epitaxial layer, and the P-type doped contact region is disposed in the N-type drift epitaxial layer. The P-type lightly doped region is disposed between the P-type contact doped region and the N-type drift epitaxial layer, and is in contact with the N-type drift epitaxial layer.

20 Claims, 8 Drawing Sheets

IGBT WITH FAST REVERSE RECOVERY TIME RECTIFIER AND MANUFACTURING METHOD THEREOF

BACKGROUND OF THE INVENTION

1. Field of the Invention

This present invention is related to an insulated gate bipolar transistor (IGBT) with a fast reverse recovery time rectifier having and a manufacturing method thereof, and more particularly, to an IGBT with a rectifier having fast reverse recovery time for speeding up the reverse recovery of the rectifier and a manufacturing method thereof.

2. Description of the Prior Art

An IGBT is regarded as a composite structure combining a metal-oxide-semiconductor field effect transistor (MOSFET) and a bipolar junction transistor (BJT). By combining the MOSFET's characteristic of easy control with a gate electrode and the BJT's characteristic of low turn-on voltage drop, the IGBT is widely applied in high voltage and high power applications.

Please refer to FIG. 1. FIG. 1 is a cross-sectional diagram illustrating a conventional IGBT. As shown in FIG. 1, the conventional IGBT 10 is described as follows. First, an N-type buffer layer 14 is formed on a P-type semiconductor substrate 12, and an N-type epitaxial layer 16 is formed on the N-type buffer layer 14 to serve as a drain electrode of a parasitic MOSFET in the IGBT 10. Then, two gate structures 18 are formed in the N-type epitaxial layer 16. Each gate structure 18 includes a gate electrode 20 and a gate insulating layer 22 for electrically isolating the gate electrode 20 and the N-type epitaxial layer 16. Subsequently, a P-type doped base region 24 is formed in the N-type epitaxial layer 16 between two gate structures 18, and two N-type doped source regions 26 are formed in the P-type base region 24 to separately contact with each gate insulating layer 22 and to serve as source electrodes of the parasitic MOSFET in the IGBT 10. Following that, a dielectric layer 28 is formed on the N-type epitaxial layer 16, the P-type base region 24 between two N-type doped source regions 26 is uncovered, and a P-type doped contact region 30 is formed in the uncovered P-type base region 24. Then, an emitter metal layer 32 is formed to cover the dielectric layer 28, the P-type doped contact region 30, and the N-type doped source region 26. Finally, a collector metal layer 34 is formed below the P-type semiconductor substrate 12.

Conventionally, the IGBT is formed on a substrate by the aforementioned semiconductor manufacturing technology. Then, the IGBT is electrically connected to an external diode for providing a rectifier function, so that the circuit component of IGBT and the diode component can be packaged in the same package structure. However, the structure, which includes IGBT connected to an external diode, has higher production cost, more complicated packaging, and is large in size, so it does not conform to a trend of high degree of precision for electronic components.

Therefore, in order to improve the degree of precision for electronic components, a method is presently utilized in the industry and is described as follows. An N-type doped cathode region is formed in the P-type semiconductor substrate of the IGBT, and the N-type doped cathode region is electrically connected to the N-type epitaxial layer and the collector metal layer, wherein the N-type epitaxial layer serves as a cathode of the diode and the P-type base region serves as an anode of the diode. Thus, the diode component can be integrated in the same integrated circuit structure by parasitizing the diode component in the IGBT. A PN junction is formed between the P-type base region and the N-type epitaxial layer, the electron carriers in the N-type epitaxial layer near the P-type base region may be injected into the P-type base region, and the hole carriers in the P-type base region near the N-type epitaxial layer may be injected into the N-type epitaxial layer, so that a depletion region is formed between the P-type base region and the N-type epitaxial layer. However, when the bias of the diode switches from the forward bias to the reverse bias, i.e. the IGBT is under the voltage-sustaining state, the depletion region of the PN junction may enlarge, i.e. to drive out the hole carriers which are injected in the N-type epitaxial layer or to exclude the excess minority carriers in the depletion region. Accordingly, reverse recovery time is required, so that the switching speed of the integrated structure of the IGBT and the diode is limited. Because the IGBT is a high voltage component which is above 600 Volts, a very thick N-type epitaxial layer is required to serve as a voltage-sustaining layer. As a result, how to decrease the injection of the excess minority carriers and improve the switching speed of an integrated structure of an IGBT and a rectifier by new structure design is an important issue in the industry.

SUMMARY OF THE INVENTION

It is therefore one of the objectives of the present invention to provide an IGBT with a fast reverse recovery time rectifier and a manufacturing method thereof to improve the reverse recovery of the rectifier, under the condition that the IGBT has the same voltage-sustaining ability, by utilizing the concentration difference in the different locations to reduce the injection of the excess minority carriers in the rectifier.

According to the present invention, an IGBT with a fast reverse recovery time rectifier is provided. The IGBT includes a collector metal layer, a semiconductor substrate having a first conductivity type, a doped cathode region having a second conductivity type, a drift epitaxial layer having the second conductivity type, at least a gate electrode, at least a gate insulating layer, at least a doped base region having the first conductivity type, at least a doped source region having the second conductivity type, at least a doped contact region having the first conductivity type, at least a lightly doped region having the first conductivity type, and an emitter metal layer. The semiconductor substrate is disposed on the collector metal layer, and the semiconductor substrate is electrically connected to the collector metal layer. The doped cathode region is disposed in the semiconductor substrate, and the doped cathode region is electrically connected to the collector metal layer. The drift epitaxial layer is disposed on the semiconductor substrate, and the drift epitaxial layer is electrically connected to the semiconductor substrate and the doped cathode region. The gate electrode and the gate insulating layer are disposed in the drift epitaxial layer, and the gate insulating layer is disposed between the drift epitaxial layer and the gate electrode. The doped base region is disposed in the drift epitaxial layer, and the doped base region is adjacently connected to the gate insulating layer. The doped source region is disposed in the doped base region, and the doped source region is adjacently connected to the gate insulating layer. The doped contact region is disposed in the doped base region and in the drift epitaxial layer, and the doped contact region is adjacently connected to the doped source region. The lightly doped region is disposed between the doped contact region and a portion of the drift epitaxial layer, wherein the portion of the drift epitaxial layer is located on a side of the doped base region opposite to the gate electrode. The emitter metal layer is disposed on the doped contact region and on the doped source region, and the emitter metal layer is electrically connected to the doped source region and the doped contact region.

According to the present invention, a manufacturing method for an IGBT with a fast reverse recovery time rectifier is provided. The manufacturing method includes the following steps. First, a semiconductor substrate having a first conductivity type is provided, and the semiconductor substrate includes an upper surface and a lower surface. Then, a doped cathode region having a second conductivity type is formed in the semiconductor substrate, and a drift epitaxial layer having the second conductivity type is formed on the upper surface of the semiconductor substrate. Subsequently, at least a gate insulating layer and at least a gate electrode are formed in the drift epitaxial layer, and the gate insulating layer is disposed between the drift epitaxial layer and the gate electrode. Following that, at least a doped base region is formed in the drift epitaxial layer which is adjacent to a side of the gate insulating layer, wherein the doped base region has the first conductivity type and the doped base region is in contact with the gate insulating layer. Then, a doped source region is formed in the doped base region, wherein the doped source region has the second conductivity type and the doped source region is in contact with the gate insulating layer. Subsequently, a doped contact region is formed in the drift epitaxial layer and in the doped base region which is located on a side of the doped source region opposite to the gate insulating layer, and a lightly doped region is formed between the doped contact region and a portion of the drift epitaxial layer, wherein the portion of the drift epitaxial layer is located on a side of the doped base region opposite to the gate insulating layer, and the doped contact region and the lightly doped region have the first conductivity type. Following that, an emitter metal layer is formed on the doped contact region and on the doped source region, whereby the emitter metal layer is electrically connected to the doped source region and the doped contact region. Then, a thinning process is performed on the lower surface of the semiconductor substrate until the first doped cathode region is exposed. Finally, a collector metal layer is formed on the lower surface of the semiconductor substrate, wherein the collector metal layer is electrically connected to the doped cathode region and the semiconductor substrate.

In the present invention, a doped base region having a first conductivity type is formed in the doped region having a second conductivity type, wherein the doped region is located on any side of each gate insulating layer, so that the doped base region between two adjacent gate electrodes is divided into two doped base regions. Accordingly, the PN junction area of the bottom of the doped base region and the doped region is decreased to reduce the required reverse recovery time and to accelerate the switching speed of the rectifier constituted by the doped base region and the doped region under the condition that the IGBT has the same voltage-sustaining ability. In addition, a lightly doped region having the first conductivity type is disposed between the doped region and the doped contact region to prevent the conduction by contacting the doped contact region of the high doping concentration with the doped region of the high doping concentration, which results from decreasing area of the doped base region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
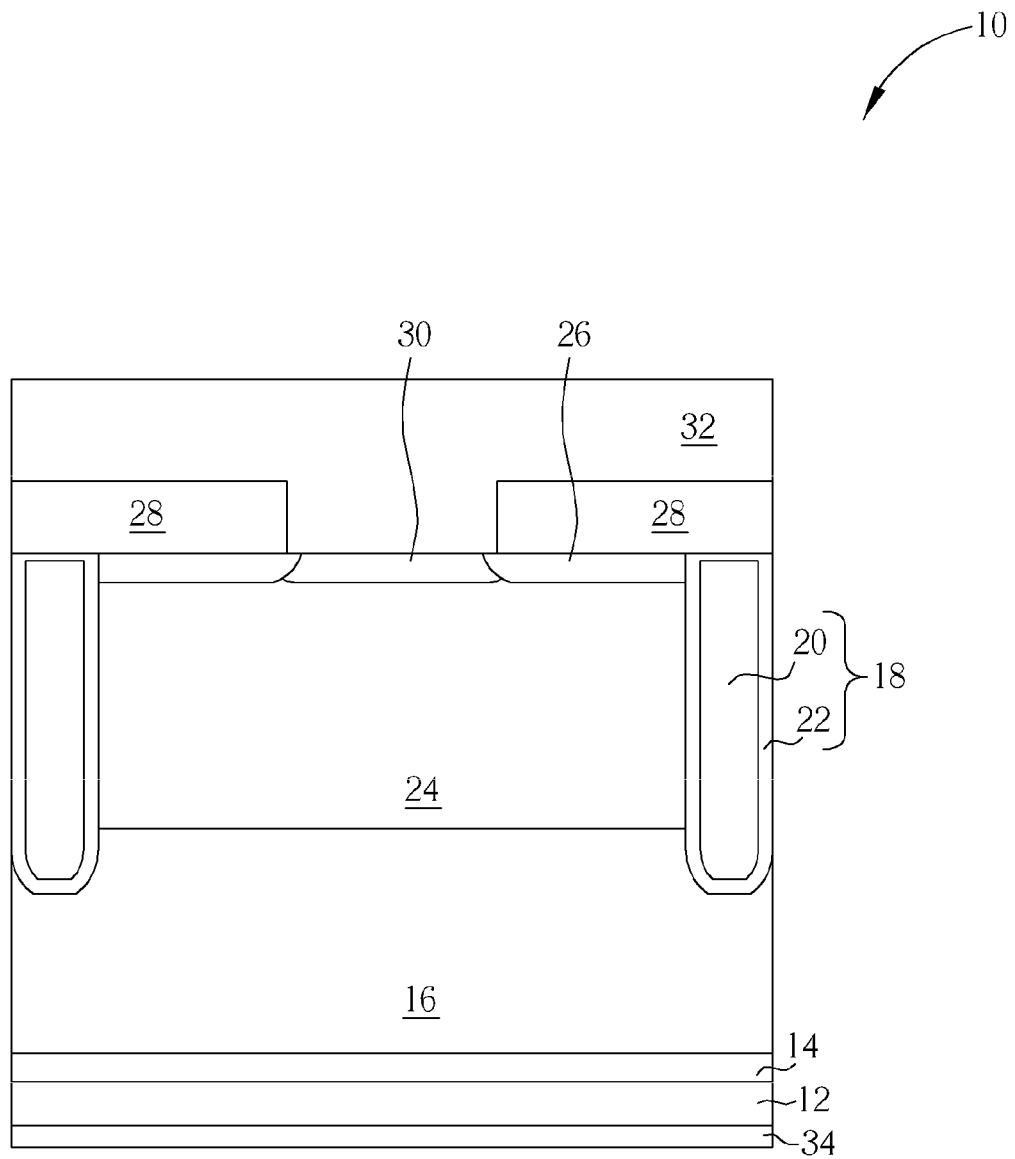
FIG. 1 is a cross-sectional diagram illustrating a conventional IGBT.
Figure 2:
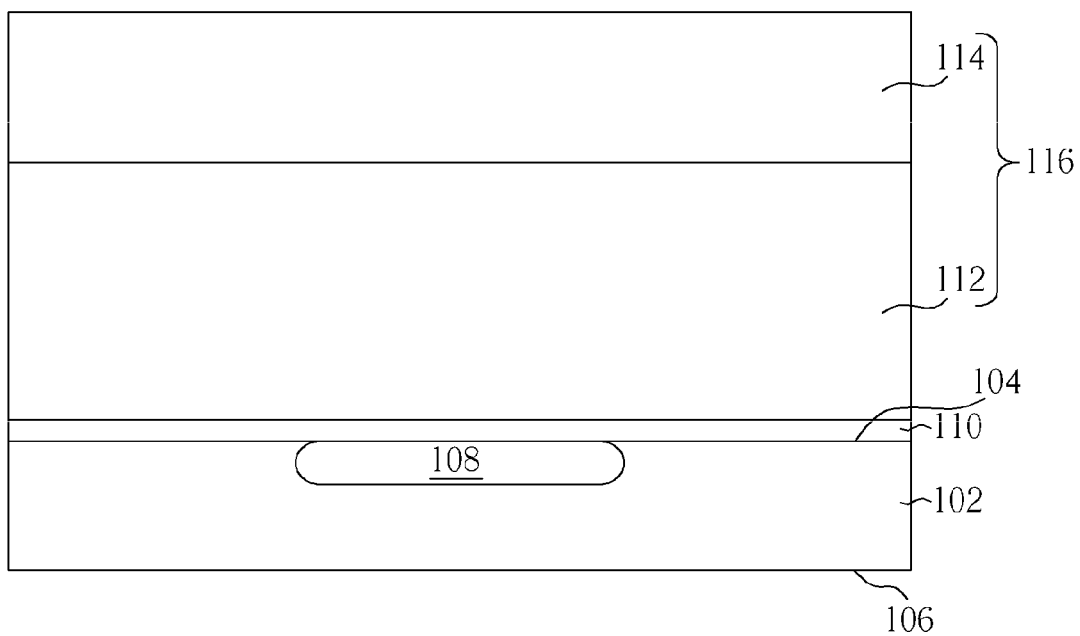
FIGS. 2-7 are schematic diagrams illustrating a method of manufacturing an IGBT with a fast reverse recovery time rectifier according to a first embodiment of the present invention.

Please refer to FIGS. 2-7. FIGS. 2-7 are schematic diagrams illustrating a method of manufacturing an IGBT with a fast reverse recovery time rectifier according to a first embodiment of the present invention. As shown in FIG. 2, a semiconductor substrate 102 having a first conductivity type, such as a heavily doped P-type semiconductor substrate, is provided first, and the semiconductor substrate 102 includes an upper surface 104 and a lower surface 106. At least a doped cathode region 108 having a second conductivity type is doped in the semiconductor substrate 102, such as an N-type doped cathode region. In addition, a buffer layer 110 is disposed on the upper surface of the semiconductor substrate 102 of the present embodiment, and an epitaxial layer 112 is disposed on the buffer layer 110, wherein the buffer layer 110 and the epitaxial layer 112 have the second conductivity type, such as N-type. The first conductivity type of the present invention is not limited to P-type, the second conductivity type is not limited to N-type, and the first conductivity type and the second conductivity type of the present invention may be exchanged. For example, the first conductivity type may be N-type, and the second conductivity type may be P-type. In the present embodiment, the first conductivity type is P-type, and the second conductivity type is N-type, but it is not limited herein. Moreover, an IGBT with a fast reverse recovery time rectifier of the present invention is not limited to include the N-type buffer layer 110, i.e. the N-type epitaxial layer 112 may be formed directly on the P-type semiconductor substrate 102, and at this case, the IGBT is a non punch-through (NPT) IGBT. In the present embodiment, the IGBT includes the N-type buffer layer 110 and the IGBT is a punch-through (PT) IGBT, but the present invention is not limited herein.

The steps for forming the N-type doped cathode region 108, the N-type buffer layer 110, and the N-type epitaxial layer 112 are described as follows. First, a lithography process is performed to form a patterned photoresist layer (not shown in the figure) on the upper surface 104 of the P-type semiconductor substrate 102. Then, the patterned photoresist layer serves as a mask to perform a first N-type ion implantation process so as to implant N-type ions in the P-type semiconductor substrate 102. Subsequently, the patterned photoresist layer is removed, and a drive-in process is performed to diffuse N-type ions in the P-type semiconductor substrate 102 to form an N-type doped cathode region 108, wherein the N-type doped cathode region 108 is electrically connected to a cathode of the rectifier. Following that, an N-type buffer layer 110 is formed on the P-type semiconductor substrate 102 and on the N-type doped cathode region 108. Then, an epitaxial process is performed to form an N-type epitaxial layer 112 on the N-type buffer layer 110. The thickness of the N-type epitaxial layer 112 may be adjusted according to the voltage-sustaining degree of the integrated structure of the IGBT and the rectifier with fast reverse recovery time.

Subsequently, a second N-type ion implantation process and a drive-in process are performed on the N-type epitaxial layer 112 to form an N-type doped region 114 in the N-type epitaxial layer 112. The N-type doped region 114 and the N-type epitaxial layer 112 which is not doped by the second N-type ion implantation process constitute an N-type drift epitaxial layer 116, wherein the N-type doped region 114 is located on the N-type epitaxial layer 112 which is not doped by the second N-type ion implantation process. It should be noted that a doping concentration of the N-type doped region 114 gradually decreases from a portion of the N-type doped region 114 located away from the N-type epitaxial layer 112 to a portion of the N-type doped region 114 located near the N-type epitaxial layer 112. For example, a doping concentration of the N-type doped region 114 located near the N-type epitaxial layer 112 is substantially $10^{15}$ cm$^{-3}$, and a doping concentration of the N-type doped region 114 located away from the N-type epitaxial layer 112 is substantially increased to $10^{16}$ cm$^{-3}$. In addition, a doping concentration of the N-type doped region 114 is larger than a doping concentration of the N-type epitaxial layer 112. For example, a doping concentration of the N-type epitaxial layer 112 is substantially between $10^{13}$ cm$^{-3}$ and $10^{14}$ cm$^{-3}$, but the present invention is not limited herein.

Figure 3:
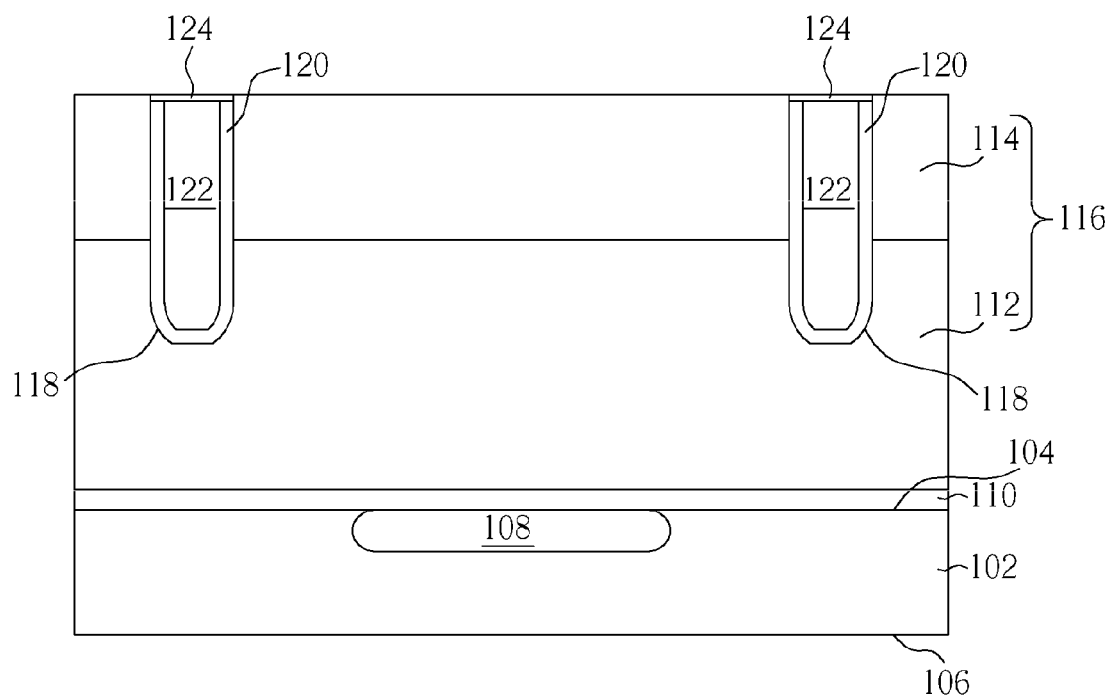

As shown in FIG. 3, a lithography and etching process is performed on the N-type drift epitaxial layer 116 to form a plurality of trenches 118 in the N-type drift epitaxial layer 116, and each trench 118 punches through the N-type doped region 114 to extend into the N-type epitaxial layer 112. Following that, a gate insulating layer 120 and a gate electrode 122 are formed in each trench 118, wherein the gate insulating layer 120 is disposed between the gate electrode 122 and the N-type drift epitaxial layer 116 for electrically isolating the gate electrode 122 and the N-type doped region 114 and electrically isolating the gate electrode 122 and the N-type epitaxial layer 112. Moreover, after the gate insulating layer 120 and the gate electrode 122 are formed in the present embodiment, an insulating layer 124 may be formed to cover each gate electrode 122 for preventing the gate electrode 122 from being damaged in the following processes, but it is not limited herein and this step may be excluded.

Figure 4:
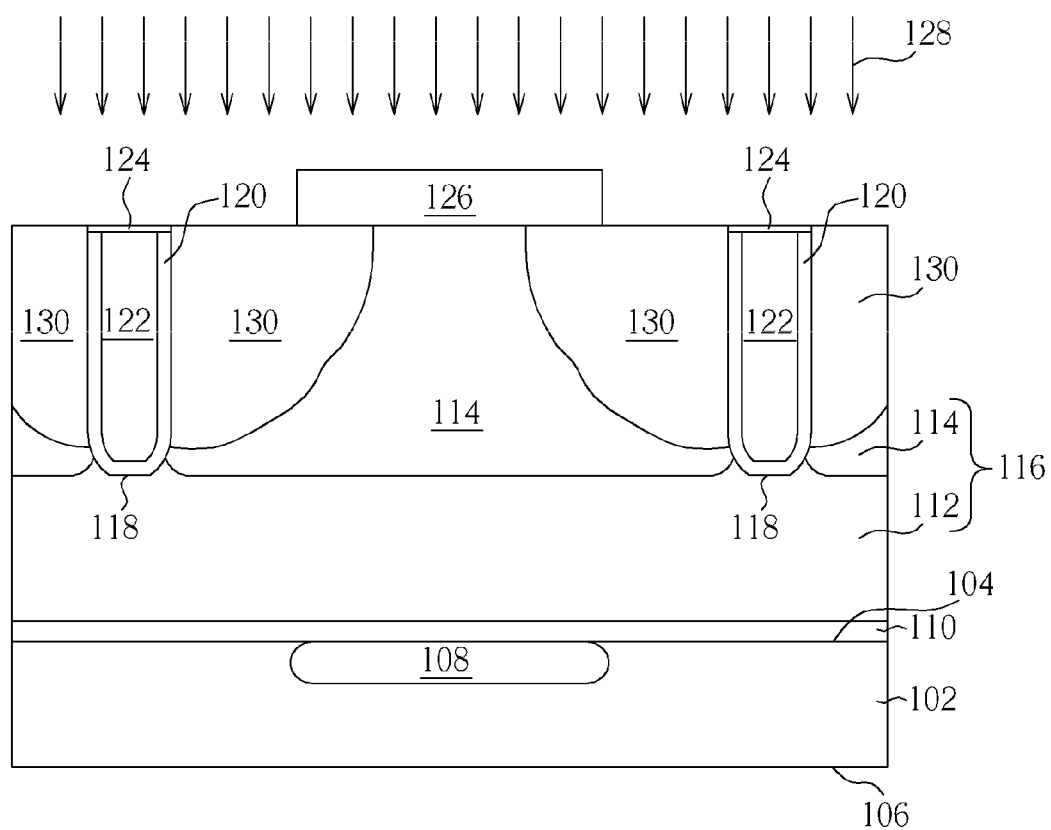

As shown in FIG. 4, a first mask (not shown in the figure) is utilized to perform a lithography process to form a first patterned photoresist layer 126 on the N-type doped region 114 between two adjacent gate electrodes 122 and to uncover a portion of the N-type doped region 114 which is adjacent to each gate insulating layer 120. Then, a first patterned photoresist layer 126 serves as a mask to perform a first P-type ion implantation process 128 to implant two P-type ion regions in the N-type doped region 114 of two sides of each gate insulating layer 120, and two P-type ion regions are adjacently connected to the gate insulating layer 120. Subsequently, the first patterned photoresist layer 126 is removed, and a drive-in process is performed to diffuse each P-type ion region. Accordingly, two P-type base regions 130 are separately formed in the N-type doped region 114 of two sides of each gate insulating layer 120, and a portion of the N-type doped region 114 is located between two P-type base regions 130 which are respectively connected to two adjacent gate insulating layers 120. In the present embodiment, the deeper a depth of the P-type base region 130 is, the smaller a horizontal cross-sectional area of the P-type base region 130 is, i.e. a horizontal cross-sectional area of the N-type doped region 114 increases as the depth become deeper. It should be noted that the present invention is not limited herein, and a horizontal cross-sectional area of the P-type base region 130 may remain the same without being affected by the change of the depth. In addition, the horizontal cross-sectional area of the P-type base region 130 may be controlled by adjusting the area of first patterned photoresist layer 126, parameters of the first P-type ion implantation process 128 and the drive-in process, so that the PN junction area between the bottom of the P-type base region 130 and the N-type doped region 114 may be adjusted to control the size of the depletion region formed between the P-type base region 130 and the N-type doped region 114.

It should be noted that, compared with the area and the depth of the PN junction formed between the P-type base region and the N-type epitaxial layer in the prior art, the first patterned photoresist layer 126 in this invention is utilized to gradually decrease from a portion of the P-type base region 130 located away from the first patterned photoresist layer 126 to a portion of the P-type base region 130 located near the first patterned photoresist layer 126. Accordingly, the PN junction area formed between the P-type base region 130 and the N-type doped region 114 may be decreased to effectively reduce the area of the depletion region between the bottom of the P-type base region 130 and the N-type doped region 114, so that the hole carriers injected into the N-type doped region 114 are decreased, i.e. the excess minority carriers in the depletion region are decreased. Therefore, the required reverse recovery time is reduced, and the switching speed of the rectifier constituted by the P-type base region 130 and the N-type doped region 114 is accelerated. In addition, a doping concentration of the N-type doped region 114 in this invention is greater than a doping concentration of the N-type epitaxial layer 112, so that the depletion region formed between the bottom of P-type base region 130 and the N-type doped region 114 is decreased and the switching speed of the rectifier constituted by the P-type base region 130 and the N-type doped region 114 is also improved.

Figure 5:
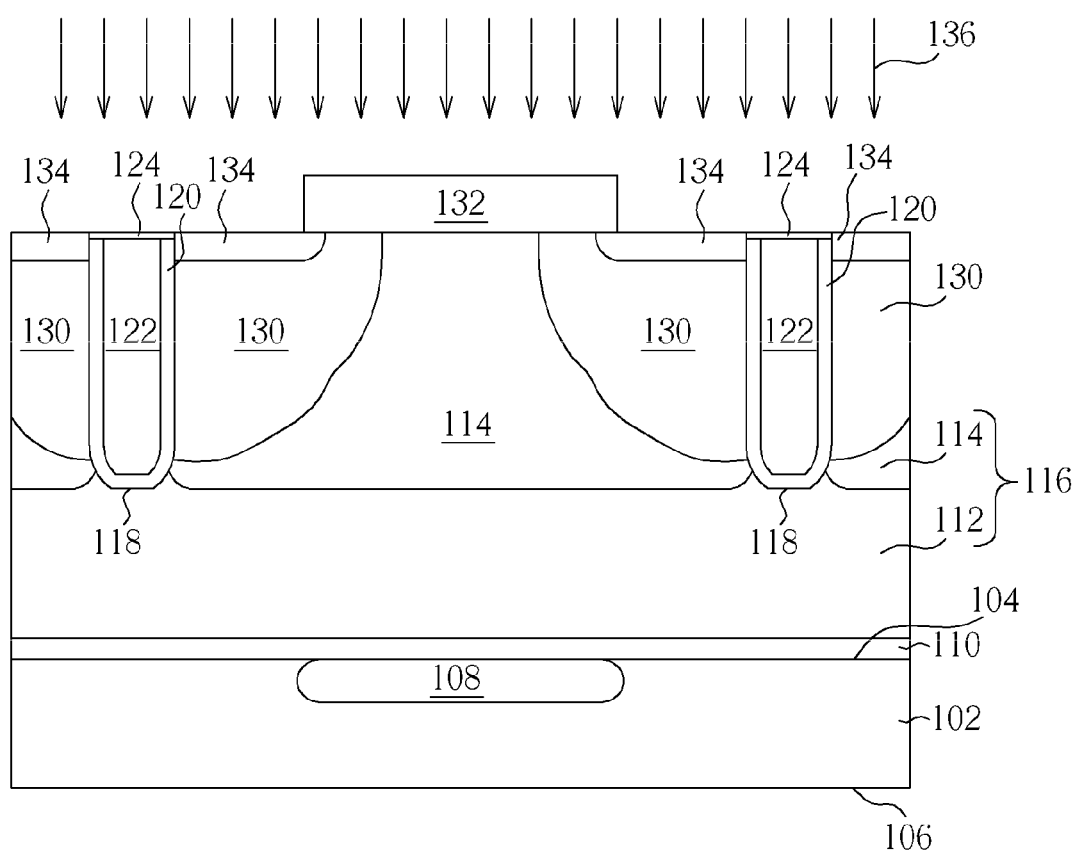

As shown in FIG. 5, the first mask is utilized to form a second patterned photoresist layer 132 having the same pattern with the first patterned photoresist layer 126 to define the location of an N-type doped source region 134. Then, the second patterned photoresist layer 132 serves as a mask to perform a third N-type ion implantation process 136 to implant N-type ions in the P-type doped base region 130. Subsequently, the second patterned photoresist layer 132 is removed, and a drive-in process is performed to form an N-type doped source region 134 which is adjacently connected to the gate insulating layer 120 and serves as a source electrode of the IGBT, wherein a doping concentration of the N-type doped source region 134 is greater than a doping concentration of the N-type doped region 114 for preventing the hole carriers from being injected into the N-type doped region 114. For example, a doping concentration of the N-type doped source region 134 is substantially between $10^{19}$ cm$^{-3}$ and $10^{20}$ cm$^{-3}$, but it is not limited herein. Moreover, the present invention is not limited to performing a drive-in process to form each P-type doped base region 130 before performing the third N-type ion implantation process 136. The present invention may also utilize the same first patterned photoresist layer 126 to perform the first P-type ion implantation process 128 and the third N-type ion implantation process 136. Then, the drive-in process is performed to simultaneously form each P-type doped base region 130 and each N-type doped source region 134.

Figure 6:
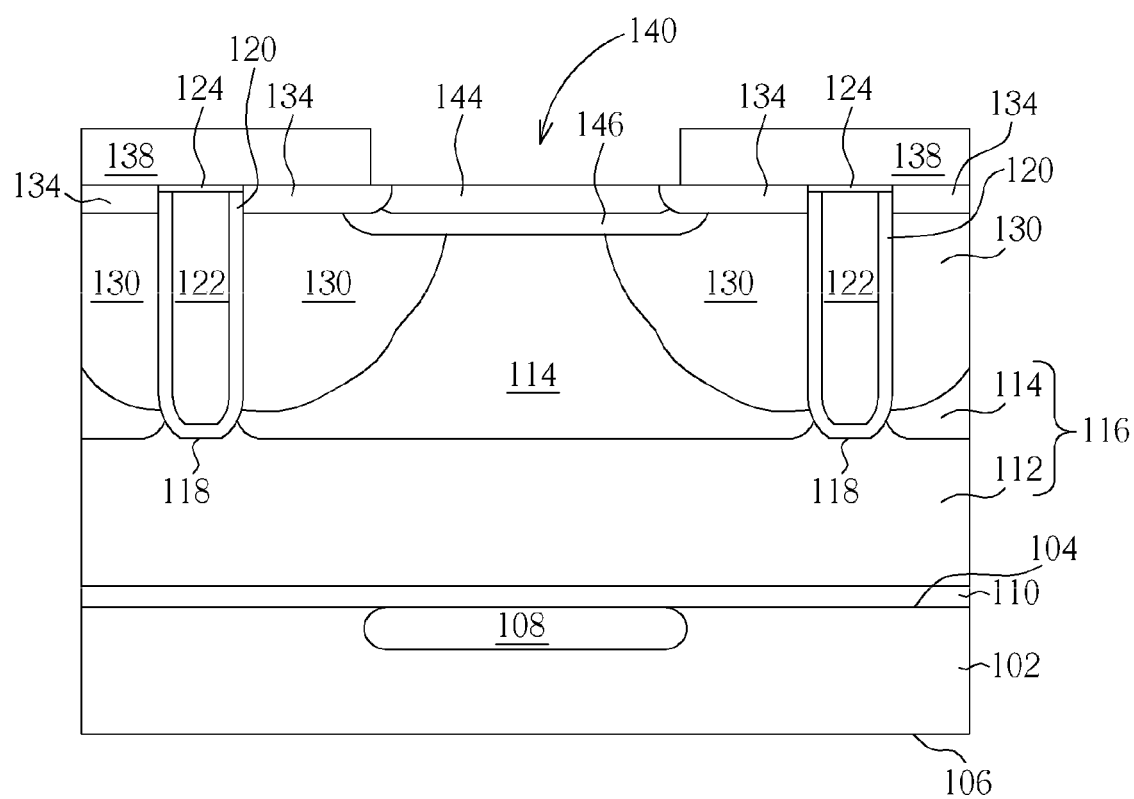

As shown in FIG. 6, an interlayer dielectric layer 138, such as a dielectric layer of borophosphosilicate glass (BPSG) or other materials, is completely formed on the N-type drift epitaxial layer 116. Then, the interlayer dielectric layer 138 is etched to form a plurality of apertures 140 to respectively uncover the N-type doped region 114 being located on a side of each N-type doped source region 134 opposite to the gate electrode 122 and a portion of each P-type doped base region 130. Subsequently, the interlayer dielectric layer 138 serves as a mask to perform a second P-type ion implantation process and a drive-in process to form a P-type doped contact region 144 in two P-type doped base regions 130 and in the N-type doped region 114 between two adjacent gate electrodes 122. The P-type doped contact region 144 is adjacently connected to two N-type doped source regions 134 of two P-type doped base regions 130, and the P-type doped contact region 144 serves as an anode of the rectifier and the doped contact region of the IGBT. Following that, the interlayer dielectric layer 138 serves as a mask to perform a third P-type ion implantation process and a drive-in process to form a P-type lightly doped region 146 between the P-type doped contact region 144 and a portion of the N-type doped region 114, wherein a portion of the N-type doped region 114 is located on a side of the P-type doped base regions 130 opposite to each gate electrode 122. Each P-type lightly doped region 146 is in contact with the N-type doped region 114, and each P-type lightly doped region 146 further extends into a region between each P-type doped contact region 144 and the corresponding P-type doped base region 130. It should be noted that the steps for forming the P-type doped contact region 144 in the present invention are not limited to be performed before forming the P-type lightly doped region 146. In the present invention, the P-type lightly doped region 146 may be formed first, and then the P-type doped contact region 144 may be formed. Or, the second P-type ion implantation process and the third P-type ion implantation process are performed first, and then a drive-in process is performed to simultaneously form a P-type doped contact region 144 and a P-type lightly doped region 146.

In addition, an implantation concentration of the second P-type ion implantation process is greater than an implantation concentration of the third P-type ion implantation process, so that a doping concentration of the P-type lightly doped region 146 is less than a doping concentration of the P-type doped contact region 144, and a doping concentration of the P-type lightly doped region 146 is substantially equal to a doping concentration of the P-type doped base region 130. For example, a doping concentration of the P-type lightly doped region 146 and the P-type doped base region 130 is substantially between $10^{16}$ cm$^{-3}$ and $10^{17}$ cm$^{-3}$, and a doping concentration of the P-type doped contact region 144 is $10^{19}$ cm$^{-3}$. But it is not limited herein. It should be noted that a doping concentration of the P-type lightly doped region 146 is less than a doping concentration of the P-type doped contact region 144, and a doping concentration of the N-type doped region 114 gradually increases from a portion of the N-type doped region 114 located away from the P-type doped contact region 144 to a portion of the N-type doped region 114 located near the P-type doped contact region 144. Therefore, in the present invention, the P-type lightly doped region 146 is disposed between each P-type doped contact region 144 and each N-type doped region 114 to prevent the conduction by contacting the P-type doped contact region 144 of the high doping concentration with the N-type doped region 114 of the high doping concentration, which results from decreasing area of the P-type doped base region 130. In addition, a vertical depth of the P-type lightly doped region 146 is shallower than a vertical depth of the P-type doped base region 130 in order to prevent the P-type lightly doped region 146 from extending to the bottom of the P-type doped base region 130, so that the PN junction area between the bottom of the P-type doped base region 130 and the N-type doped region 114 in the same depth will not enlarge.

Figure 7:
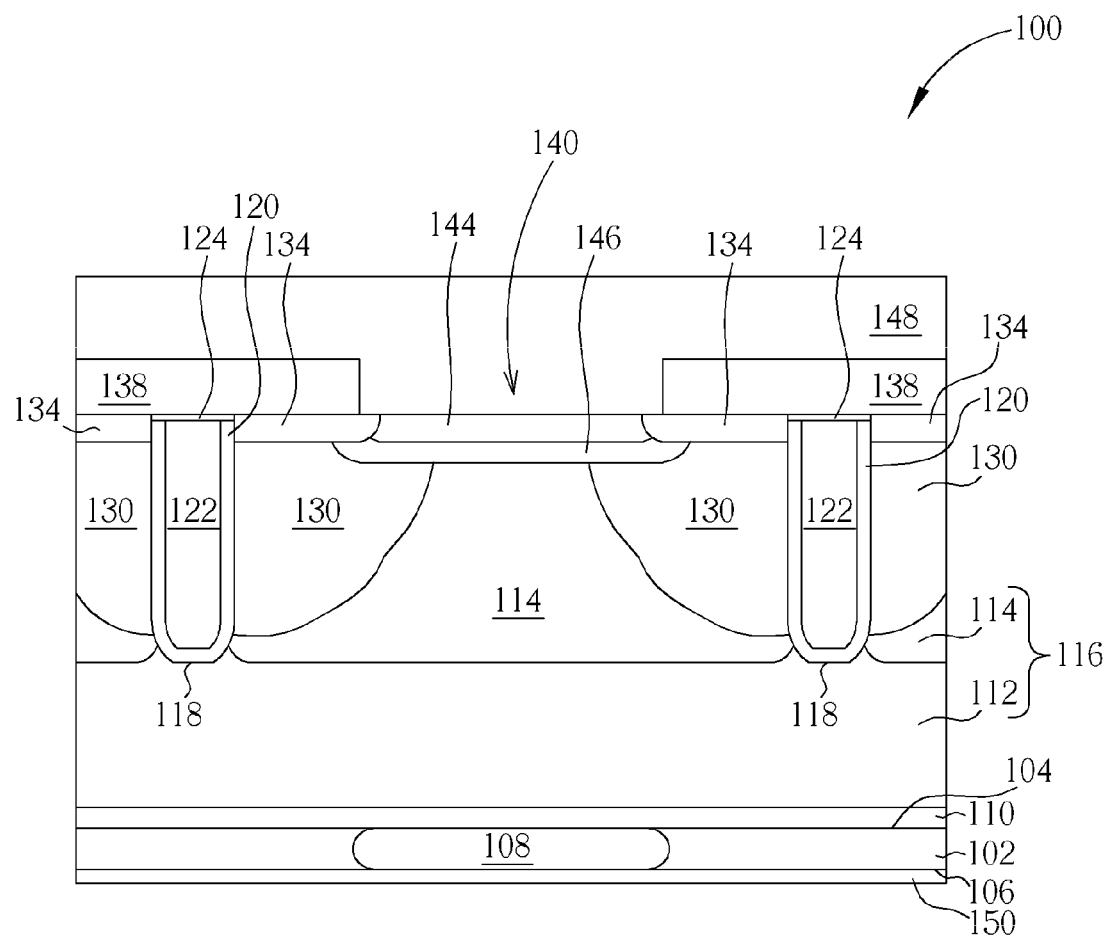

As shown in FIG. 7, a deposition process is performed to form an emitter metal layer 148 on the interlayer dielectric layer 138 and in each aperture 140 of the interlayer dielectric layer 138 to serve as a contact plug for electrically connecting to each N-type doped source region 134 and each P-type doped contact region 144. Then, a thinning process is performed on the lower surface 106 of the P-type semiconductor substrate 102 until uncovering the N-type doped cathode region 108. Subsequently, a collector metal layer 150 is formed on the lower surface 106 of the P-type semiconductor substrate 102, and the collector metal layer 150 is electrically connected to the N-type doped cathode region 108 and the P-type semiconductor substrate 102. Accordingly, the IGBT 100 with the fast reverse recovery time rectifier is finished. Moreover, the emitter metal layer 148 and the collector metal layer 150 may be a metal layer such as an aluminum layer, a TiN layer, or a tungsten layer, but it is not limited herein.

Moreover, the IGBT with the fast reverse recovery time rectifier is not limited to having a plurality of trenches, a plurality of gate electrodes, and a plurality of gate insulating layers, and the IGBT may only have a single trench, a single gate electrode, and a single gate insulating layer. In that case, the P-type doped base region is only disposed on two sides of the gate electrode, and the N-type doped region is disposed on a side of the P-type doped base region opposite to the gate electrode.

Figure 8:
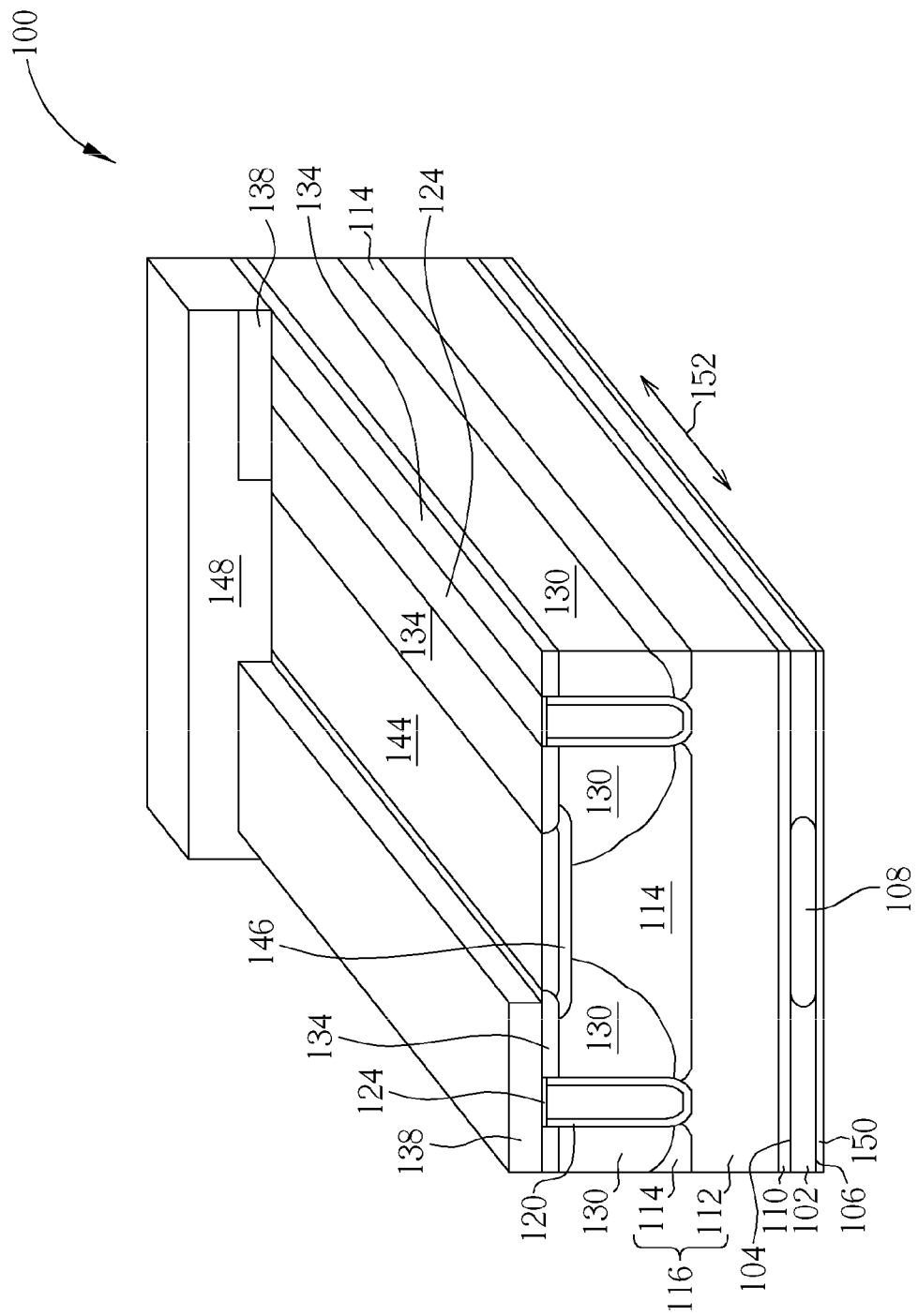
FIG. 8 is a cross-sectional diagram illustrating an IGBT with a fast reverse recovery time rectifier according to a first embodiment of the present invention.

Please refer to FIG. 8 and FIG. 7. FIG. 8 is a cross-sectional diagram illustrating an IGBT with a fast reverse recovery time rectifier according to a first embodiment of the present invention. As shown in FIG. 8, in order to clearly reveal the structure of each component, a portion of the interlayer dielectric layer 138 and the emitter metal layer 148 along a direction 152 is not shown in the figure. The IGBT 100 with the fast reverse recovery time rectifier is a long rod structure constituted by the cross-sectional diagram of FIG. 7 along the direction 152 of the FIG. 8. Therefore, the aforementioned PN junction area between the P-type doped base region 130 and the N-type doped region 114 depends on the horizontal width of the bottom of the P-type doped base region 130, and the horizontal cross-sectional area of the P-type doped base region 130 depends on the horizontal width of the P-type doped base region 130. In the present embodiment, the horizontal width of the P-type doped base region 130 is substantially between 1 micrometer and 3 micrometers, and the horizontal width of the N-type doped region 114 between two P-type doped base regions 130 is substantially between 1 micrometer and 5 micrometers. But it is not limited herein.

In the present invention, a patterned photoresist layer serves as a mask to form a P-type doped base region in the N-type doped region which is located on any side of each gate insulating layer, so that the P-type doped base region between two adjacent gate electrodes is divided into two P-type doped base regions. Accordingly, the PN junction area of the bottom of the P-type doped base region and the N-type doped region is decreased to reduce the required reverse recovery time and to accelerate the switching speed of the rectifier constituted by P-type doped base region and the N-type doped region. In addition, a P-type lightly doped region of the present invention is disposed between the N-type doped region and the P-type doped contact region to prevent the conduction by contacting the P-type doped contact region of the high doping concentration with the N-type doped region of the high doping concentration, which results from decreasing area of the P-type doped base region.

Those skilled in the art will readily observe that numerous modifications and alterations of the device and method may be made while retaining the teachings of the invention.

What is claimed is:

1. An insulated gate bipolar transistor (IGBT) with a fast reverse recovery time rectifier, comprising:
   a collector metal layer;

a semiconductor substrate having a first conductivity type and being disposed on the collector metal layer, wherein the semiconductor substrate is electrically connected to the collector metal layer;

at least a doped cathode region having a second conductivity type and being disposed in the semiconductor substrate, wherein the doped cathode region is electrically connected to the collector metal layer;

a drift epitaxial layer having the second conductivity type and being disposed on the semiconductor substrate, wherein the drift epitaxial layer is electrically connected to the semiconductor substrate and the doped cathode region;

at least a gate electrode disposed in the drift epitaxial layer;

at least a gate insulating layer disposed between the drift epitaxial layer and the gate electrode;

at least a doped base region having the first conductivity type and being disposed in the drift epitaxial layer, wherein the doped base region is adjacently connected to the gate insulating layer;

at least a doped source region having the second conductivity type and being disposed in the doped base region, wherein the doped source region is adjacently connected to the gate insulating layer;

at least a doped contact region having the first conductivity type and being disposed in the doped base region and in the drift epitaxial layer, wherein the doped contact region is adjacently connected to the doped source region;

at least a lightly doped region having the first conductivity type and being disposed between the doped contact region and the drift epitaxial layer, the drift epitaxial layer being located on a side of the doped base region opposite to the gate electrode, and the lightly doped region being in contact with the drift epitaxial layer; and an emitter metal layer being disposed on the doped contact region and the doped source region, wherein the emitter metal layer is electrically connected to the doped source region and the doped contact region.

2. The IGBT of claim 1, wherein a depth of the lightly doped region is shallower than a depth of the doped base region.

3. The IGBT of claim 1, wherein the drift epitaxial layer comprises:

a doped region being disposed at the bottom of the doped base region and extending to a side of the doped base region opposite to the gate electrode, whereby the doped region is in contact with the lightly doped region; and an epitaxial layer being disposed between the doped region and the semiconductor substrate.

4. The IGBT of claim 3, wherein a doping concentration of the epitaxial layer is less than a doping concentration of the doped region.

5. The IGBT of claim 4, wherein the doping concentration of the doped region gradually decreases from a portion of the doped region located away from the epitaxial layer to a portion of the doped region located near the epitaxial layer.

6. The IGBT of claim 3, wherein a doping concentration of the doped region is less than a doping concentration of the doped source region.

7. The IGBT of claim 1, wherein a doping concentration of the lightly doped region is less than a doping concentration of the doped contact region.

8. The IGBT of claim 1, wherein a horizontal cross-sectional area of the doped base region gradually increases from a portion of the doped base region located away from the doped contact region to a portion of the doped base region located near the doped contact region.

9. The IGBT of claim 1, further comprising a buffer layer, wherein the buffer layer has the second conductivity type, and the buffer layer is disposed between the drift epitaxial layer and the semiconductor substrate.

10. The IGBT of claim 1, wherein the first conductivity type is P-type, and the second conductivity type is N-type.

11. A manufacturing method for an insulated gate bipolar transistor (IGBT) with a fast reverse recovery time rectifier, the manufacturing method comprising the steps of:

providing a semiconductor substrate, wherein the semiconductor substrate has a first conductivity type, and the semiconductor substrate comprises an upper surface and a lower surface;

forming a first doped cathode region in the semiconductor substrate, wherein the first doped cathode region has a second conductivity type;

forming a drift epitaxial layer on the upper surface of the semiconductor substrate, wherein the drift epitaxial layer has the second conductivity type;

forming at least a gate insulating layer and at least a gate electrode in the drift epitaxial layer, wherein the gate insulating layer is disposed between the drift epitaxial layer and the gate electrode;

forming at least a doped base region in the drift epitaxial layer which is adjacent to a side of the gate insulating layer, wherein the doped base region has the first conductivity type and the doped base region is in contact with the gate insulating layer;

forming a doped source region in the doped base region, wherein the doped source region has the second conductivity type and the doped source region is in contact with the gate insulating layer;

forming a doped contact region in the drift epitaxial layer and the doped base region which is located on a side of the doped source region opposite to the gate insulating layer, and forming a lightly doped region between the doped contact region and the drift epitaxial layer, the drift epitaxial layer being located on a side of the doped base region opposite to the gate insulating layer, wherein the doped contact region and the lightly doped region have the first conductivity type;

forming an emitter metal layer on the doped contact region and the doped source region, whereby the emitter metal layer is electrically connected to the doped source region and the doped contact region;

performing a thinning process on the lower surface of the semiconductor substrate until the first doped cathode region is exposed; and forming a collector metal layer on the lower surface of the semiconductor substrate, wherein the collector metal layer is electrically connected to the doped cathode region and the semiconductor substrate.

12. The manufacturing method of claim 11, wherein the steps for forming the doped base region comprise:

performing a lithographic process to form a first patterned photoresist layer on the drift epitaxial layer which is located on a side of the gate insulating layer, and uncovering a portion of the drift epitaxial layer which is adjacent to a side of the gate insulating layer;

performing a first ion implantation process of the first conductivity type on the uncovered portion of the drift epitaxial layer; and removing the first patterned photoresist layer, and performing a first drive-in process to form the doped base region in the drift epitaxial layer which is adjacent to a side of the gate insulating layer.

13. The manufacturing method of claim 12, wherein the steps for forming the doped source region comprise forming a second patterned photoresist layer, and a pattern of the second patterned photoresist layer is the same as a pattern of the first patterned photoresist layer.

14. The manufacturing method of claim 11, wherein the steps for forming the drift epitaxial layer comprise:
   forming an epitaxial layer on the upper surface of the semiconductor substrate; and
   forming a doped region in the epitaxial layer, wherein a doping concentration of the doped region is greater than a doping concentration of the epitaxial layer, and the epitaxial layer and the doped region constitute the drift epitaxial layer.

15. The manufacturing method of claim 14, wherein the doped base region is formed in the doped region.

16. The manufacturing method of claim 14, wherein a doping concentration of the epitaxial layer is less than a doping concentration of the doped region.

17. The manufacturing method of claim 16, wherein the doping concentration of the doped region gradually decreases from a portion of the doped region located away from the epitaxial layer to a portion of the doped region located near the epitaxial layer.

18. The manufacturing method of claim 14, wherein a doping concentration of the doped region is less than a doping concentration of the doped source region.

19. The manufacturing method of claim 11, wherein the steps for forming the doped contact region and the lightly doped region comprise:
   performing a second ion implantation process of the first conductivity type and a second thermal drive-in process to form the doped contact region; and
   performing a third ion implantation process of the first conductivity type and a third thermal drive-in process to form the lightly doped region.

20. The manufacturing method of claim 11, wherein a doping concentration of the lightly doped region is less than a doping concentration of the doped contact region.

* * * * *